(12) United States Patent
Grothen et al.

(10) Patent No.: US 6,981,889 B1
(45) Date of Patent: Jan. 3, 2006

(54) SIGNAL ISOLATING BLINDMATE CONNECTOR

(75) Inventors: Victor M. Grothen, Winsor, CA (US); Frank E. Hamlin, Santa Rosa, CA (US); Dick Stump, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/903,271

(22) Filed: Jul. 30, 2004

(51) Int. Cl.
*H01R 13/64* (2006.01)

(52) U.S. Cl. ..................... 439/374; 439/248

(58) Field of Classification Search .. 439/246–248, 374
See application file for complete search history.

(56) References Cited

U.S. PATENT DOCUMENTS

| | | | | |
|---|---|---|---|---|
| 4,044,279 | A | * | 8/1977 | Tsuzurahara et al. ..... 315/39.51 |
| 5,413,504 | A | * | 5/1995 | Kloecker et al. ........... 439/620 |
| 5,552,701 | A | | 9/1996 | Veteran et al. |
| 5,558,541 | A | | 9/1996 | Botka et al. |
| 6,146,184 | A | * | 11/2000 | Wilson et al. .............. 439/374 |
| 6,224,407 | B1 | * | 5/2001 | Duquerroy et al. ......... 439/188 |
| 6,280,228 | B1 | * | 8/2001 | Maciejewski et al. ...... 439/374 |
| 6,435,897 | B1 | * | 8/2002 | Paul et al. .................. 439/374 |
| 6,837,724 | B2 | * | 1/2005 | McDaid et al. ............. 439/188 |
| 6,848,925 | B2 | * | 2/2005 | Nishide ...................... 439/247 |

* cited by examiner

*Primary Examiner*—Tho D. Ta
(74) *Attorney, Agent, or Firm*—Cynthia S. Mitchell

(57) ABSTRACT

A self-aligning, signal isolating blindmate connector is presented. The blindmate connector may include a male blindmate connector adapted for receiving a female connector; a female connector and a shroud covering a junction between a mated male blindmate connector and a female connector.

5 Claims, 5 Drawing Sheets

SIGNAL ISOLATING BLINDMATE CONNECTOR

BACKGROUND OF THE INVENTION

Programmable electronic circuit testers, such as the Agilent Technologies, Inc. 93000, are typically used during the manufacture of electronic devices and integrated circuit to test the performance of the device or integrated circuit being manufactured. Tests are conducted to assure that the device or integrated circuit satisfies associated design performance specifications. In order to test the device or integrated circuit, the tester is programmed to send an electrical signal or a suite of electrical signals to the device under test (DUT) and to measure the response(s) back from the DUT. The tester may test finished packaged devices or integrated circuits at various stages between initial wafer processing and final packaging.

A conventional tester 10, is shown in FIG. 1. Tester 10 comprises a test head 12 electrically connected by cables routed through a conduit 14 to rack(s) 16 of electronic test and measurement instruments, such as AC and DC signal generators for applying electrical signals to a device or integrated circuit interfaced to the test head 12, and signal analyzers, for example, a network analyzer, spectrum analyzer, oscilloscope, or other waveform digitizing or signal processing equipment, for measuring the response(s) to applied signals. Test head 12 may include circuitry that performs distribution of electrical signals, signal separation, frequency translation, amplification, attenuation, switching, or other conditioning or modification of electrical signals prior to being routed to the rack 16 or to a device or integrated circuit being tested.

Test head 12 interfaces to a device or integrated circuit through a load board 18 and a fixture board 20 mounted to the test head 12. Alternatively, prior to installation of fixture board 20, a calibration board (not shown), having a configuration similar to the fixture board may be connected to the test head 12 for calibrating the test head 12. The configuration of the load board 18 depends on the type or family of device or integrated circuit being tested, such as an analog or digital electronic circuit, while the configuration of the fixture board 20 is generally specific to the family or particular device or integrated circuit under test (DUT).

Fixture board 20 interfaces to a device-under-test (DUT) board 22 that may comprise inductors, capacitors, and other electronic components or circuit mounted to or fabricated on the DUT board for decoupling, filtering attenuating or otherwise modifying electrical signals transmitted to or received from a device or integrated circuit under test. Finally, the DUT board 22 is connected to a socket 24 for effecting electrical connection(s) between tester 10 and the actual electronic circuit or device under test (DUT), such as a packaged device or integrated circuit 26. Alternatively, socket 24 may be mounted directly to fixture board 20.

Test head 12 is mounted to a dolly 28. Test head 12 may be mounted by pivotal connections 30 to dolly 28. Pivotal connections 30 enable test head 12 to be positioned in an approximately upward facing horizontal position so that the appropriate load board 18 and calibration or fixture board 20 and DUT board 22 with socket 24 can be mounted to test head 12 of tester 10 by an operator. Test head 12 may be pivoted to any angular position so that socket 24 may interface with an automated material handler 32, for example, which rapidly feeds each DUT 26 to the tester 10 to be tested.

Alternatively, a wafer probe (not shown) may be substituted for the socket 24 mounted to the DUT board 22. Pivotal connections 30 enable test head 12 to be pivoted to an inverted position to test devices or integrated circuits on a wafer (not shown) at a wafer probing station (not shown).

In order to interface socket 24 to the automated material handler 32, or a wafer probe (not shown) at a wafer probing station (not shown), a frame 34 is mounted to test head 12. A jig 36 that mates with frame 34 is mounted to the automated material handler 32 or wafer probing station (not shown) to align test head 12 with the handler or station so that packaged devices or integrated circuits or devices or integrated circuits on wafer can be tested.

The connectors (not shown) through which test head 12 is electrically connected to the calibration or fixture board 20 are subjected to many connections and disconnections during calibration and actual testing with tester 10. However, the useful life of the tester 10 has heretofore greatly exceeded the useful life of the connectors in test head 12 and calibration or fixture board 20. Also, the repeatability of the connections that are made decreases over time as the connectors degrade due to wear of the connectors. Moreover, high frequency coaxial connectors are relatively fragile, and the center conductor of such a connector can become damaged if the operator is not careful when coupling, decoupling and handling connectors. Furthermore, high frequency coaxial connectors are susceptible to RF energy leaking into or out of the connector, which can degrade the signal quality.

It would therefore be desirable to provide a connector structure to enable test head 12 to be repeatably connected and disconnected to the calibration or fixture board 20 over a longer period of the useful life of the tester 10. Additionally, it would be desirable to provide a relatively rugged connector structure whereby the connector is less susceptible to wear and damage during coupling, decoupling and handling of the connectors. It would further be desirable to provide a connector that has improved signal isolation between connectors. Such a structure would facilitate the use of the tester 10 to perform setup and calibration, as well as the measurement process.

SUMMARY OF THE INVENTION

A blindmate connector with improved mating alignment and signal integrity is presented. In particular, the blindmate connector is an electrically conductive, approximately cylindrical male blindmate connector, adapted to receive a female connector; an electrically conductive, approximately cylindrical female connector; and an electrically conductive shroud having a first section surrounding a portion of the female connector and a second section adapted to receive the male blindmate connector as the male blindmate connector is mated with the female connector, the second section of the shroud surrounds and extends along an outer surface of the male blindmate connector when the male blindmate connector is mated with the female connector.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
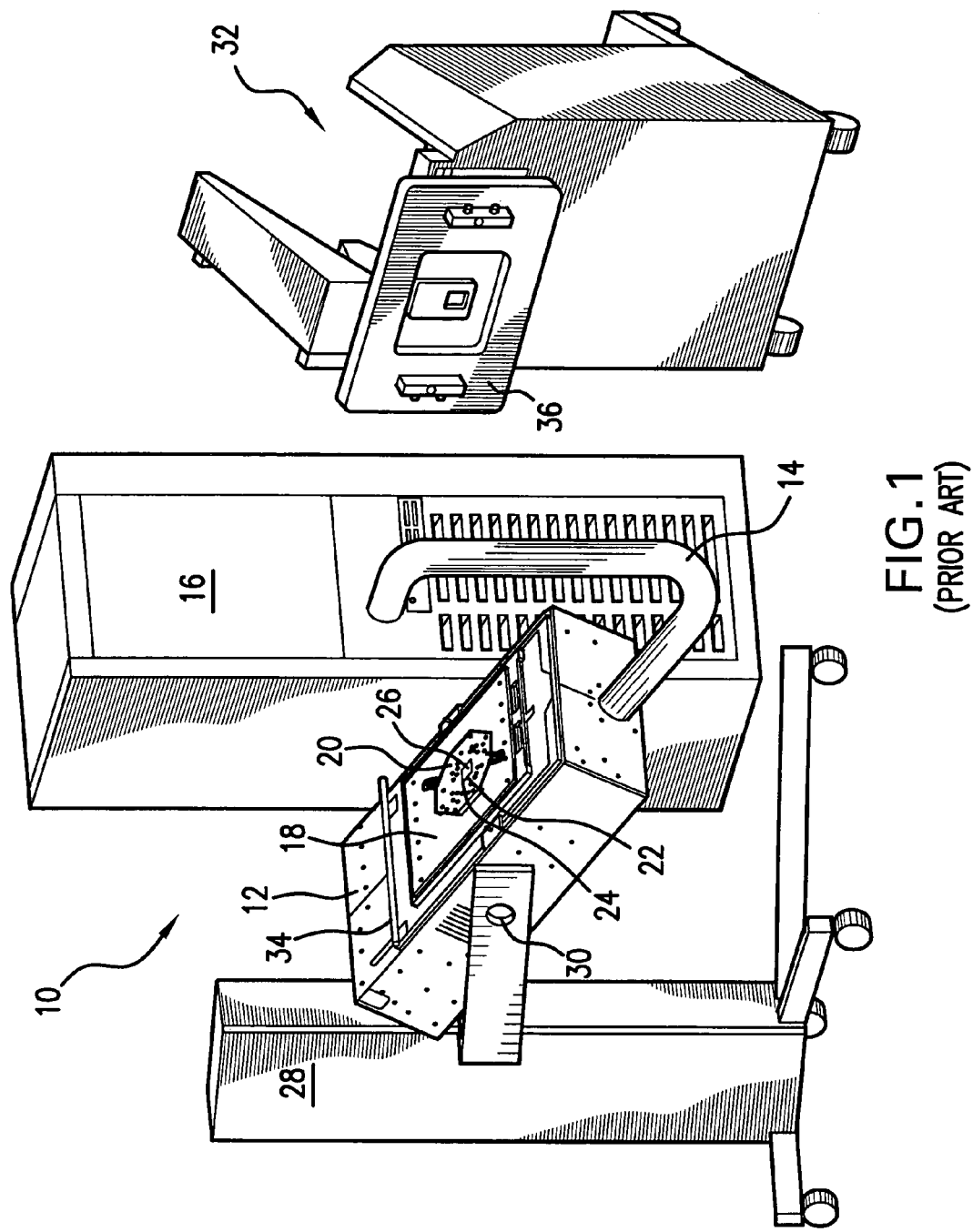
FIG. 1 illustrates an isometric view of a conventional electronic circuit tester.
Figure 2:
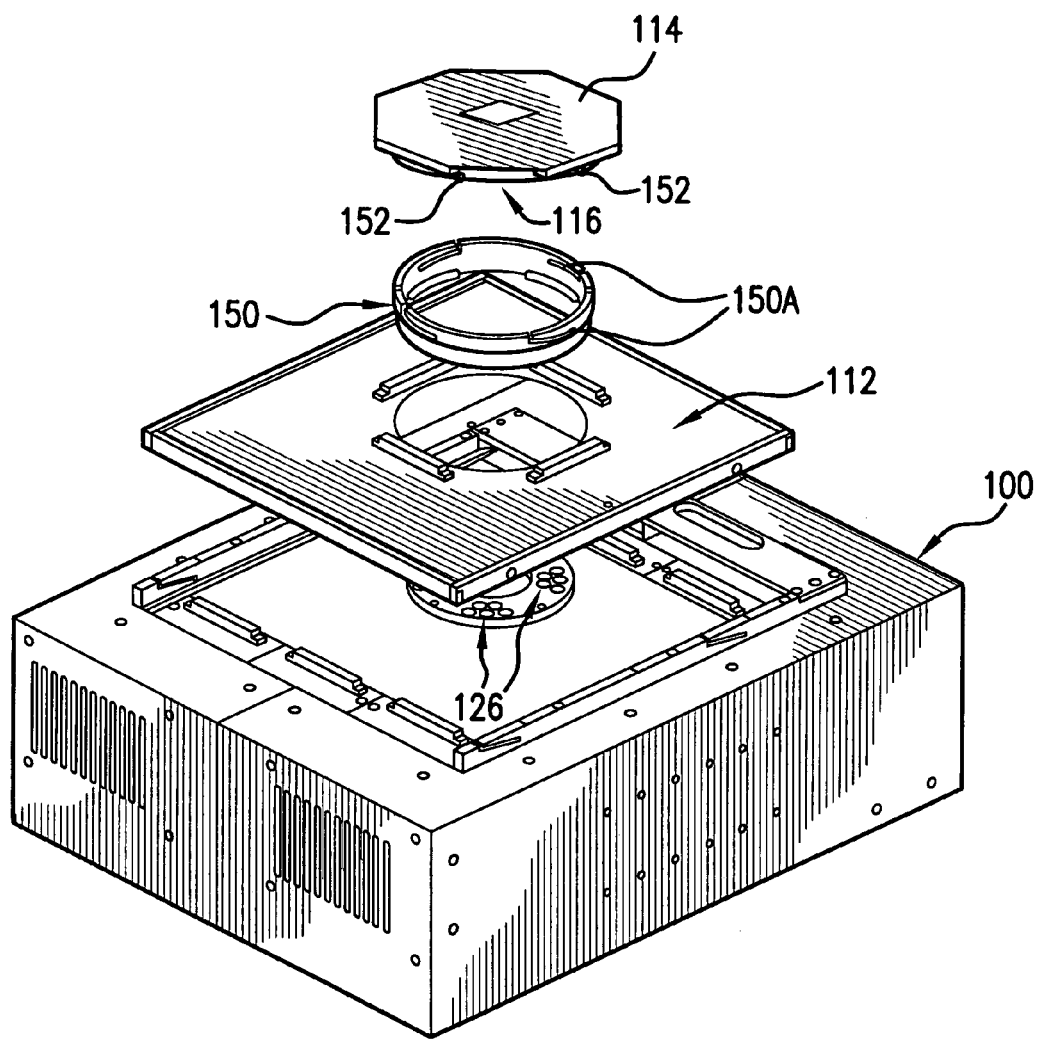
FIG. 2 illustrates an exploded view of a test head, load board, and fixture board in the electronic circuit tester shown in FIG. 1, into which an improved blind mate connector in accordance with one embodiment of the invention is incorporated.
Figure 3:
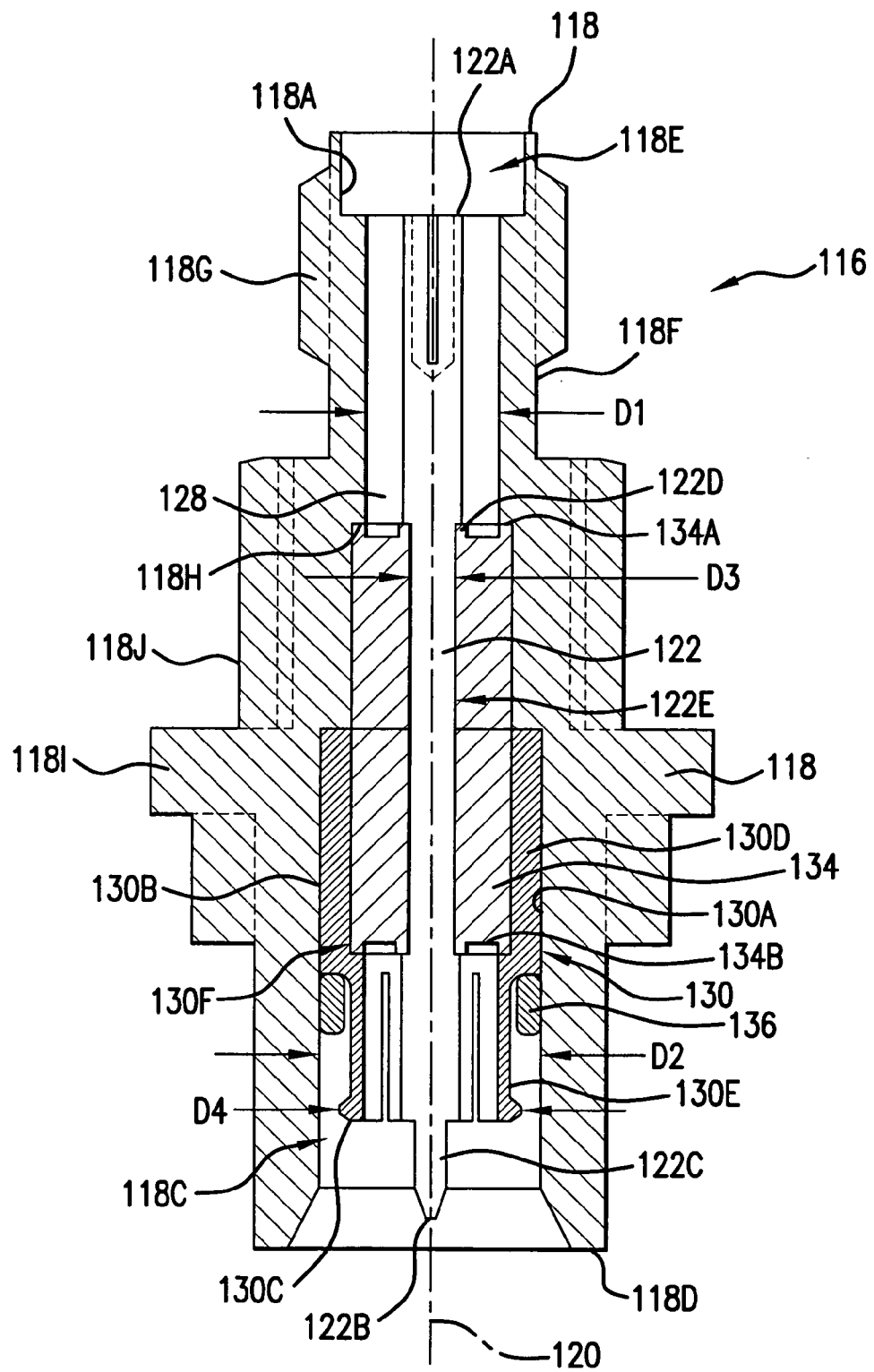
FIG. 3 illustrates a cross-sectional view of a male blindmate connector in accordance with one embodiment of the invention.
Figure 4:
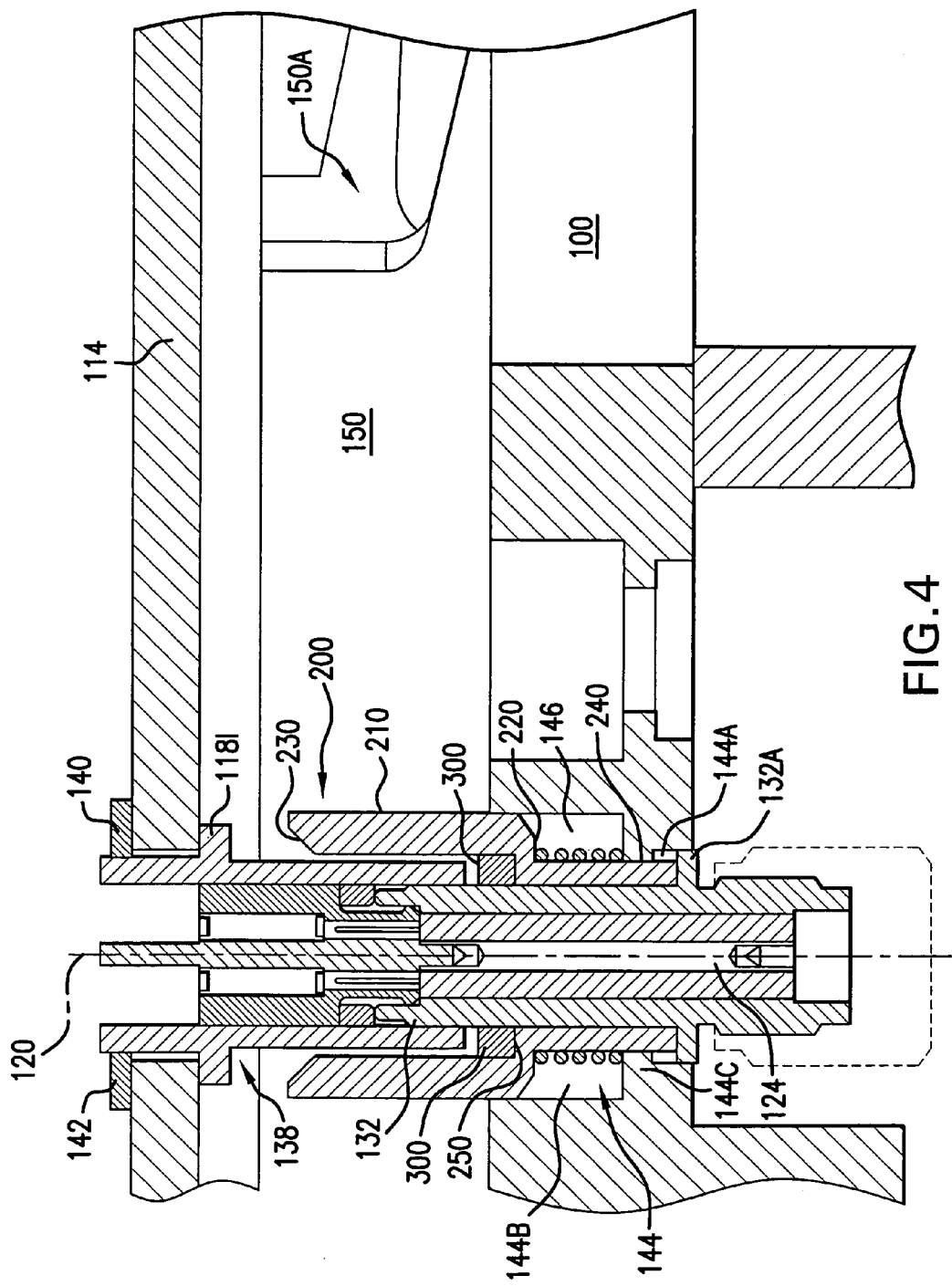
FIG. 4 illustrates a cross-sectional view of a compliant female connector incorporated into a test head of an electronic circuit tester for connection with the male blindmate connector in accordance with one embodiment of the invention.
Figure 5:
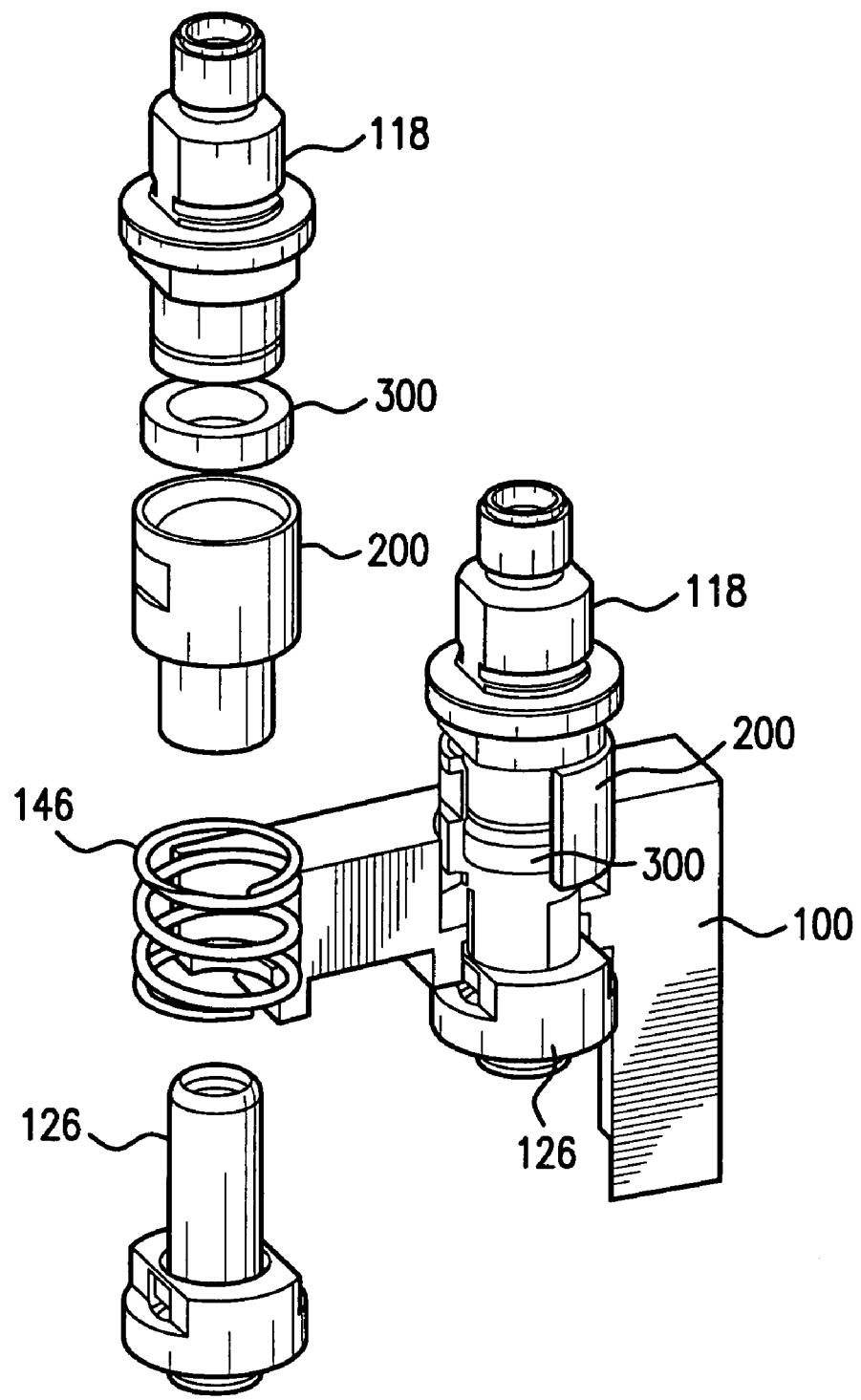
FIG. 5 illustrates a perspective view of a male blindmate mated with a compliant female connector and a perspective, exploded view of a male blindmate and compliant female connector in accordance with one embodiment of the invention.

FIG. 2 shows a portion of an electronic circuit tester, namely, a test head 100, a load board 112, and a fixture board 114. In accordance with one embodiment of the invention, a male blindmate connector 116, as shown in FIGS. 3–5, may be incorporated into fixture board 114 for interconnecting test head 100 and fixture board 114. Also, male blindmate connector 116 may be incorporated into a calibration board (not shown), which may be substituted for fixture head 114 during setup and calibration of the electronic circuit tester.

In operation, calibration or fixture board 114 may be installed on test head 100 so that one or more male blindmate connectors 116 mate with a corresponding number of female connectors 126 mounted in the test head 100. For example, there can be twenty male blindmate connectors 116 and 20 corresponding female connectors 126, as partially shown in FIG. 2

Test head may comprise a pull down/eject ring 150 for installing the calibration or fixture board 114 on test head 100. Pull down/eject ring 150 may have a plurality of slots 150A. Calibration or fixture board 114 may have a plurality of pins 152, which fit into slots 150A, such that rotation of the board 114 causes axial movement of the male blindmate connectors 116 toward the female connectors 126 for effecting connection between the board 114 and test head 100.

Male blindmate connector 116, as shown in more detail in FIG. 3 may comprise an electrically conductive, approximately cylindrical body portion 118, having a central axis 120. Body portion 118 may have a first, inner diameter D1. By way of example, body portion 118 may have an interior surface 118A adapted to internally receive an outer conductor of a male connector (note shown) at a first end 118B of body portion 118. Additionally, body portion 118 may have a relieved region 118C at a second end 118D of the body portion. Body portion 118 may also have a second inner diameter D2 at the relieved region 118C. Interior surface 118A at second end 118D of body portion 118 may be tapered outwardly to provide a guide for a female connector (not shown in FIG. 3) during insertion into the second end of body portion 118.

Male blindmate connector 116 may further comprise an electrically conductive approximately cylindrical-solid center conductor 122 having an axis corresponding to central axis 120. By way of example, center conductor 122 may have a female end 122A juxtaposed with first end 118B of body portion 118 and adapted to contact a center conductor (not shown) of a male connector (not shown) inserted into the first end of the body portion. The center conductor 122 may also have a male end 122B juxtaposed with the second end 118D of the body portion 118 and adapted to contact a center conductor 124 of a female connector 126 inserted into the second end of the body portion, as shown in FIG. 4. Male end 122B of the center conductor 122 may comprise a male pin 122C integral with the center conductor 122.

As shown in FIG. 3, center conductor 122 has an exterior surface 122E opposite the interior surface 118A of body portion 118. Center conductor 122 may have a diameter D3 less than the first inner diameter D1 of body portion 118 to provide an interstitial region 128 between body portion 118 and center conductor 122.

First end 118B of body portion 118 may comprise a second relieved region 118E for insertion of the outer conductor (not shown) of a male conductor (not shown). Additionally, female end 122A of center conductor 122 may be slotted, as shown in FIG. 3, to receive a male pin (not shown) integral with center conductor (not shown) of the male connector (not shown) when the male connector is inserted. Also, body portion 118 may have an exterior surface 118F comprising threads 118G at first end 118B of body portion to mate with a coupling nut (not shown) of the male connector (not shown) after the male connector is inserted into the first end 118B of body portion 118.

Male blindmate connector 116 may also comprise an electrically conductive approximately cylindrical sleeve 130 having an axis corresponding to the central axis 120 and an internal surface 130A and an external surface 130B. The sleeve 130 is disposed in the relieved region 118C at the second end 118D of body portion 118 in electrical contact with body portion 118. An increased diameter portion 130C of sleeve 130 is adapted to contact an outer conductor 132 of female connector 126 inserted into the second end 118D of body portion 118, as shown in FIG. 4. The sleeve 130 may comprise a solid cylindrical portion 130D having an outer diameter approximately corresponding to the inner diameter D2 of the relieved region 118C at the second end 118D of body portion 118 and a slotted portion 130E having an outer diameter D4 smaller than the outer diameter of the solid cylindrical portion 130D of the sleeve.

Male blindmate connecter 116 may also comprise dielectric material 134 disposed in the interstitial region 128 for supporting the center conductor 122 within body portion 118. As shown in FIG. 3, each of the interior surface 118A of body portion 118, interior surface 130A of sleeve 130, and exterior surface 122C of center conductor 122 may comprise stepped sections 118H, 130F and 122D, respectively. Additionally, the dielectric material 134 may be a cylinder of dielectric material interposed in the interstitial region 128 between the respective stepped sections 118H and 130F of body portion 118, on the one hand, and the stepped section 122D of the exterior surface 122C of center conductor 122 on the other hand, to retain the dielectric material. Also, the cylinder of dielectric material 134 has first and second ends 134A and 134B which may be relieved, as shown in FIG. 3, to provide inductive compensation for capacitance introduced by the stepped sections 118H and 130F of interior surfaces 118A and 130A of body portion 118 and sleeve 130 and the stepped section 122D of exterior surface 122C of the center conductor 122.

Finally, male blindmate connector 116 may comprise means 136 for retaining sleeve 130 in body portion 118 when the sleeve is mounted within the body portion. Means

136 for retaining sleeve 130 may comprise a retaining ring having an outer diameter corresponding substantially to the inner diameter D2 of the relieved region 118C of body portion 118 and disposed within the second end 118D of body portion 118 at approximately the intersection of the solid cylindrical portion 130D and the slotted portion 130E of the sleeve 130.

As shown in FIGS. 3 and 4, the male blindmate connector 116 may comprise means 138 for mounting the male blindmate connector 116 to a calibration or fixture board 114. Means 138 for mounting the male blindmate connector 116 may comprise an annular flange 118I integral with the exterior surface 118F of body portion 118 intermediate the first and second ends 118B and 118D of body portion 118. Means 138 for mounting male blindmate connector 116 may also comprise a threaded section 118J of the exterior surface 118F of body portion 118 disposed between flange 118I and one of the first and second ends 118B and 118D of body portion 118. As shown in FIG. 4, threaded section 118J may be adapted to be inserted through a hole 140 in the calibration or fixture board 114 until flange 118I abuts the board and to receive a nut 142 to mount male blindmate connector 116 to the board by sandwiching the board between flange 118I and nut 140.

As shown in FIGS. 4 and 5, male blindmate connector 116 may be mounted to calibration or fixture board 114 and mated to female connector 126. Female connector 126 may be a standard subminiature series A (SMA) or 3.5 millimeter connector. Female connector 126 may also be a compliantly mounted connector, as shown in FIG. 4. Accordingly, the outer conductor 132 of female connector 126 may comprise a skirt 132A that resides in a first portion 144A of a cylinder 144 provided in test head 100. A spring 146 may be disposed in a second portion 144B of the cylinder 144. First and second portions 144A and 144B of cylinder 144 may be separated by an iris 144C.

Finally, a shroud 200 is mounted to the outer conductor 132 of female connector 126 between outer conductor 132 of female connector 126 and spring 146, so that spring 146 is captured between the iris 144C and a ledge 148A of shroud 200. Shroud 200 may have a collar 240 that surrounds the outer conductor 132 of female connector 126. Shroud 200 may have a cuff 210 that extends from the collar 240 and surrounds the exterior surface 118F at the second end 118D of the male blindmate connector 118.

The inner diameter of collar 240 of shroud 200 is slightly greater than the outer diameter of the outer conductor 132, but less than the skirt 132A. The inner diameter of the cuff 210 of shroud 200 is slightly greater than the outer diameter of the male blindmate connector 118 at the second end 118D. The tolerances between cuff 210 of shroud 200 and the exterior surface 118F of male blindmate 118 may be as close as possible without interfering with alignment when the male blindmate connector 118 is being mated with the female connector 126. The small gap between the cuff 210 of shroud 200 and the male blindmate connector 118 combined with the length of the cuff 210 extending over the male blindmate connector 118 create a waveguide like bandpass structure that will decrease signal leakage and cross-talk between different mated connector pairs 118 and 126 over certain frequency ranges.

Consequently, in operation, the spring 146 biases the shroud 200 and, hence, the female connector 126 away from iris 144C of cylinder 144 of test head 100 toward male blindmate connector 116. Extension of female connector 126 toward male blindmate connector 116 is limited by skirt 132A encountering iris 144C. Female connector 126 moves axially in first and second cylinder portions 144A and 144B of cylinder 144 of test head 100, so that contact is effected between outer conductor 132 of the female connector and the increased diameter portion 130C of the male blindmate connector 116.

When female connector 126 and male blindmate connector 118 are mated, collar 240 of shroud 200 surrounds a portion of the female connector 126 between skirt 132A and the second end 118D of male blindmate connector 118, while cuff 210 surrounds and extends up the second end 118D of the male blindmate connector 118. Thus, shroud 200 effectively covers and extends in either direction over the area mating junction between the male blindmate connector 118 and female connector 126, providing improved RF and signal isolation into or out of the mated connectors 118 and 126 for improved signal integrity.

Shroud 200 provides pre-alignment as the male blindmate connector 118 and female connector 126 are beginning to engage during mating, which allows the amount of movement in the female connector 126 to be increased and also permits full tolerance stack up. Shroud 200 may include a tapered inner edge 230 at the open end of the cuff 210 for further alignment improvement as the male blindmate connector 118 is being mated with the female connector 126.

In operation, the male blindmate connector 118 may be attached with many other male blindmate connectors 118 to a calibration or fixture board 114. The male blindmate connectors 118 on the calibration or fixture board 114 will be brought into contact and interface with corresponding female connectors 126 mounted to a test head 100. The female connectors may be mounted to permit some movement side to side, up and down as well as gimble. This movement may permit improved self-alignment with corresponding male blindmate connectors 118 during mating. Alignment problems may prevent mating, causing damage to connectors 118 and 126 or cause variations in microwave performance and signal integrity of mated connectors.

Shroud 200 may be made of nickel-plated aluminum, stainless steel, brass, beryllium copper or any other known metallic material. Shroud 200 may be made by machining or other similar known method.

As shown in FIGS. 4 and 5, a washer 300 may be used in shroud 200 to further improve signal integrity. Washer 300 may be substantially cylindrical with an inner diameter similar to the inner diameter of collar 240 and larger than the outer diameter of female connector 126. Washer 300 may have an exterior diameter that is slightly less than the inner diameter of cuff 210, such that when washer 300 is disposed within shroud 200, washer 300 surrounds outer contact 132 of female connector 126 and rests between shelf 250 of shroud 200 and the second end 118D of male blindmate connector 118.

In one embodiment, washer 300 may comprise a microwave absorbing material, such as polyiron. In this embodiment, washer 300 may or may not contact the second end 118D of male blindmate connector 118 when engaged within connectors 118 and 126. In this embodiment, washer 300 absorbs RF energy from leaking into or out of mated connectors 118 and 126, thus further improving signal integrity within the mated connectors.

In an alternative embodiment, washer 300 may comprise a thicker, compressible, conductive material, such as a conductive elastomer, or any similar material. In this embodiment, washer 300 would be in contact with the second end 118D of male blindmate connector 118 to function more like a gasket and seal the junction between female connector 126 and male blindmate connector 118 against RF leakage into or out of the mated connectors, thus further improving signal integrity within the mated connectors.

Shroud 200 acts as a spring retainer, RF/signal isolation means, provides pre-alignment and improves self-alignment during mating of male blindmate 118 and female connector 126. Washer 300 improves signal isolation between mated blindmate connector pairs 118 and 126.

It will be appreciated from the above detailed description that the blindmate connector of the present invention provides improved alignment and signal integrity for blindmate connectors. Other embodiments are anticipated without deviating from the present invention, for example blindmate connectors may be used for other connections, such as high frequency connections from modules to other subsystems, connections to benchtop instruments in a production environment etc. Although this preferred embodiment of the present invention has been disclosed for illustrative purposes, those skilled in the art will appreciate that various modifications, additions and substitutions are possible, without departing from the scope and spirit of the invention, resulting in equivalent embodiments that remain within the scope of the appended claims.

What is claimed is:

1. A blindmate connector, comprising:
    an electrically conductive, approximately cylindrical male blindmate connector, adapted to receive an inner electrical conductor of a female connector;
    an electrically conductive, approximately cylindrical female connector having an inner electrical conductor and an outer electrical conductor; and
    an electrically conductive shroud having a first section surrounding a portion of the outer electrical conductor of the female connector between a spring and the outer electrical conductor of the female connector and a second section extending from the first section and adapted to receive the male blindmate connector as the male blindmate connector is mated with the female connector, the second section of the shroud surrounds and extends along an outer surface of the male blindmate connector forming a waveguide type frequency limiting structure when the male blindmate connector is mated with the female connector.

2. The blindmate connector in accordance with claim 1, comprising:
    a microwave-absorbing washer disposed within the electrically conductive shroud and surrounding the female connector.

3. The blindmate connector in accordance with claim 1, comprising:
    an electrically conductive washer disposed within the electrically conductive shroud and surrounding the female connector.

4. The blindmate connector in accordance with claim 1, wherein the electrically conductive washer further comprises:
    an electrically conductive compressive material that is held compressively between the male blindmate connector and a shelf within the shroud.

5. The blindmate connector in accordance with claim 1, wherein the second section of the shroud is tapered to provide alignment during mating of the male blindmate connector and the female connector.

* * * * *

UNITED STATES PATENT AND TRADEMARK OFFICE
CERTIFICATE OF CORRECTION

PATENT NO. : 6,981,889 B1 Page 1 of 1
APPLICATION NO. : 10/903271
DATED : January 3, 2006
INVENTOR(S) : Grothen et al.

It is certified that error appears in the above-identified patent and that said Letters Patent is hereby corrected as shown below:

In column 8, line 22, in Claim 4, delete "claim 1" and insert - - claim 3 - -, therefor.

Signed and Sealed this

Twenty-ninth Day of August, 2006

JON W. DUDAS
*Director of the United States Patent and Trademark Office*